United States Patent
Montrose et al.

(10) Patent No.: US 6,940,285 B2
(45) Date of Patent: Sep. 6, 2005

(54) METHOD AND APPARATUS FOR TESTING A MICRO ELECTROMECHANICAL DEVICE

(75) Inventors: Charles J. Montrose, Clintondale, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 10/250,272

(22) Filed: Jun. 19, 2003

(65) Prior Publication Data

US 2004/0257086 A1 Dec. 23, 2004

(51) Int. Cl.[7] .................. G01R 31/327; G01R 31/02
(52) U.S. Cl. .................. 324/420; 324/415; 324/760
(58) Field of Search ................ 324/415, 418, 324/419, 420, 754, 760, 763, 76.59, 603, 522, 99 D; 200/181

(56) References Cited

U.S. PATENT DOCUMENTS

| | | | | |
|---|---|---|---|---|
| 1,560,727 A | * | 11/1925 | Harold | 324/419 |
| 3,816,812 A | * | 6/1974 | Alber et al. | 324/712 |
| 4,864,285 A | * | 9/1989 | Rodden | 340/644 |
| 5,742,513 A | * | 4/1998 | Bouhenguel et al. | 700/286 |
| 5,760,595 A | | 6/1998 | Edwards et al. | 324/703 |
| 6,232,790 B1 | | 5/2001 | Bryan et al. | 324/754 |
| 6,407,560 B1 | * | 6/2002 | Walraven et al. | 324/752 |
| 6,489,857 B2 | | 12/2002 | Petrarca et al. | 333/105 |
| 6,708,132 B1 | * | 3/2004 | Gutierrez et al. | 702/117 |
| 6,744,264 B2 | * | 6/2004 | Gogoi et al. | 324/658 |
| 6,750,655 B2 | * | 6/2004 | Staple et al. | 324/415 |
| 6,798,209 B2 | * | 9/2004 | Lavoie et al. | 324/424 |
| 2002/0106144 A1 | * | 8/2002 | Garverick et al. | 385/18 |
| 2003/0048149 A1 | | 3/2003 | Deligianni et al. | 333/101 |
| 2003/0132752 A1 | * | 7/2003 | Johnson et al. | 324/418 |

* cited by examiner

*Primary Examiner*—Anjan Deb
(74) *Attorney, Agent, or Firm*—Lisa U. Jaklitsch; Cantor Colburn LLP

(57) ABSTRACT

A system and method for testing performance characteristics of a MEMs device includes an activation driver configured to receive and drive a waveform to an activation side of the micro electromechanical device and configured to provide readback of an activation voltage and activation current drawn by activation of the micro electromechanical device. A switch driver configured to provide a load to a switch side of the micro electromechanical device provides readback of a load voltage and a load current drawn by the micro electromechanical device. A contact-closure counter and master control card (MCC) is included to control the activation and switch drivers while a digital volt meter (DVM) is in operable communication with the micro electromechanical device to read back analog readback. An analog multiplexer provides the analog readback to a corresponding activation driver or switch driver. A computer having software provides system control, data acquisition, data storage, and data analysis is in operable communication with the multiplexer, DVM and MCC.

16 Claims, 5 Drawing Sheets

METHOD AND APPARATUS FOR TESTING A MICRO ELECTROMECHANICAL DEVICE

BACKGROUND OF INVENTION

The method and apparatus of the present invention relate generally to testing micro electromechanical relays. More particularly the method and apparatus of the present invention relate to testing quality and reliability of micro electromechanical relays.

In the past few years, many micromechanical and micro electromechanical devices (hereinafter collectively referred to as "MEMs devices") that include mechanical members have been made from silicon or other etchable materials using fabrication processes and equipment that are developed for standard semiconductor integrated circuit chips. These MEMs devices are advantageous because they be made with microfabrication techniques having increased precision, allow for smaller miniaturization, and generally have lower power requirements.

One of the MEMs devices being actively pursued by IBM is the MEMs-based relay for application in the radio frequency (or RF) communication technologies. This is because the switching characteristics of a MEMs relay is superior to those of traditional switches like the GaAs MESFET, and the p-i-n diode. For example, MEMs relays have much lower power consumption rates, lower insertion losses, and much higher linearity. All these features make MEMs relays a great candidate for wireless communication applications like a wireless transceiver in a cellular phone.

A MEMs relay is simply a miniature mechanical switch that switches on and off in response to a DC voltage bias actuation. When a DC actuation voltage is applied, the electrostatic force changes the switch position to make contact between the RF signal electrodes that results in an ohmic contact to allow the RF signal to pass through. To further reduce the insertion loss and improve the switch linearity, the RF signal electrodes are separate from the DC actuation electrodes.

Although the development of MEMs devices having etched mechanical members has been expanding, several manufacturing problems have not yet been adequately addressed. For example, one problem is testing the MEMs devices to qualify a MEMs device for a user's particular application to ensure that the devices provide the desired operational and performance characteristics. It is typically desirous to execute a series of stresses and measurements on samples of the proposed devices so that quality and reliability can be evaluated prior to user implementation. Cost and schedule advantages are achieved by stress testing in identifying only good performing devices worthy of investment for assembly, and quantifying device performance at completion of fabrication (thus communicating device characteristics at completion of fabrication, unmasked by further assembly effects).

Prior art MEMS switches require a large voltage to actuate the MEMS switch. Such a voltage is typically termed a "pull-down" or "pull-in" or actuation voltage, and, in the prior art may be anywhere from 20 to 40 volts or more in magnitude. To explain further, a typical MEMS switch uses electrostatic force to cause mechanical movement that results in electrically bridging a gap between two contacts such as in the bending of a cantilever. In general this gap is relatively large in order to achieve a large impedance during the "off" state of the MEMS switch. Consequently, the aforementioned large pull-down voltage of anywhere from 20 to 40 volts or more is usually required in these designs to electrically bridge the large gap, while a smaller maintaining voltage may be employed to maintain the bridge. Also, a typical MEMS switch has a useful life of approximately $10^8$ to $10^9$ cycles. Thus, in addition to the above concerns, there is an interest in increasing the lifetime of such MEMS switches.

Thus, there is a need for a method and apparatus for the purpose of performing a quality and reliability study of a proposed MEMs switch that has the ability to measure basic device parameters, such as pull-down, activating or actuating voltage, drop-out voltage, contact resistance and their impact on the switch lifetime.

SUMMARY OF INVENTION

In an exemplary embodiment, a system is described for providing controlled stress to a micro electro mechanical system (MEMS) relay. This controlled stress is for the purpose of testing performance characteristics of a MEMS relay for quality and reliability qualification. The stress system includes an activation driver designed to receive and drive a waveform or precise DC level to the activation side of the MEMS relay, and to provide readback of this applied activation voltage as well as the current drawn by the activation structure of the MEMS relay. The system further includes a switch driver designed to provide a load (open contact voltage, and closed contact current) to the switch side of the MEMS relay, and to provide readback of the voltage across and current through the contacts of the MEMS relay. The switch driver also embodies a counter used to count the number of contact closures. A master control card (MCC) is in communication with the computer controller, and is included to control the activation and switch drivers, to generate the activation waveform/voltage, and to control the analog readback multiplexer. The analog readback multiplexer is designed to interface a digital volt meter (DVM) to the sense points of the activation and switch drivers, providing readback of the analog parameters (e.g., voltage, current, etc.). The DVM is used to read all of the analog parameters by way of the readback multiplexer and is under the control of the computer controller. The computer controller has software written to provide system control, data acquisition, data storage, and data analysis and is in operable communication with the multiplexer, DVM and MCC, as well as a server for test data accessibility. The system is capable of providing stress (e.g., high activation voltage, switch load, temperature, etc.), measuring performance parameters (e.g., pull-in voltage, drop-out voltage, etc.), and specifying lifetime parameters (e.g., number of closures vs. switch load).

DETAILED DESCRIPTION

Figure 1:
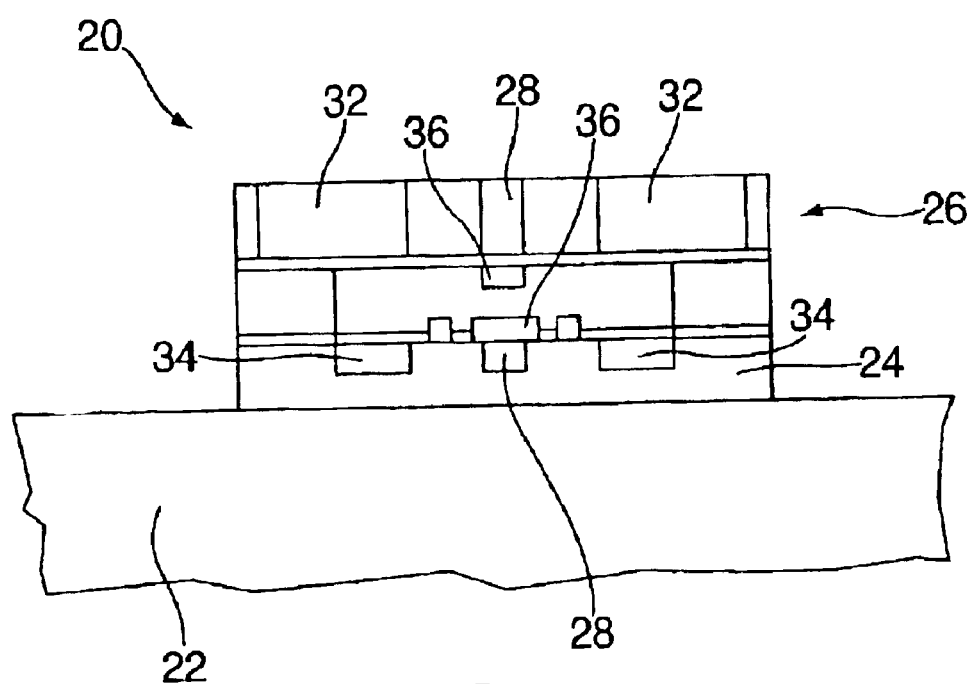
FIG. 1 is a side elevational view of a prior art, cantilever beam microswitch.

FIG. 1 is illustrative of a known micro electromechanical switch (MEMS). As shown, the MEMS, generally identified by reference numeral 20, is formed on a substrate 22 with fixed posts 24 formed at the ends. A flexible cantilever beam 26 is anchored on both posts 24. The cantilever beam 26 flexes when a DC bias voltage is applied between the upper and lower actuation electrodes 32 and 34, respectively, and the upper and lower RF signal lines 28 make contact to transmit the RF signal. The lower actuation electrode 34, or the grounding plate, is adapted to be connected to ground while the upper actuation electrode 32, or the field plate, is adapted to be selectively coupled to a DC voltage source (not shown). With no voltage applied to the field plate 32, corresponding contacts 36 of respective RF signal lines 28 are separated from each other, defining an open circuit state. When an appropriate DC voltage is applied to field plate 32, the cantilever beam 26 is deflected by the electrostatic forces between plate 32 and ground plate 34, causing signal contacts 36 to mate with each other, defining a closed circuit state. When the applied voltage is subsequently removed from the field plate 30b, the cantilever beam 26 returns to its static position due to the restoring forces in the beam.

An exemplary system and method for the purpose of providing controlled stress to a MEMS (micro electromechanical system) relay will now be described with reference to FIG. 2. The system and method include the ability to measure basic device parameters such as pull-in voltage, drop-out voltage, contact resistance, and lifetime (measured in the number of actions before failure).

Figure 2:
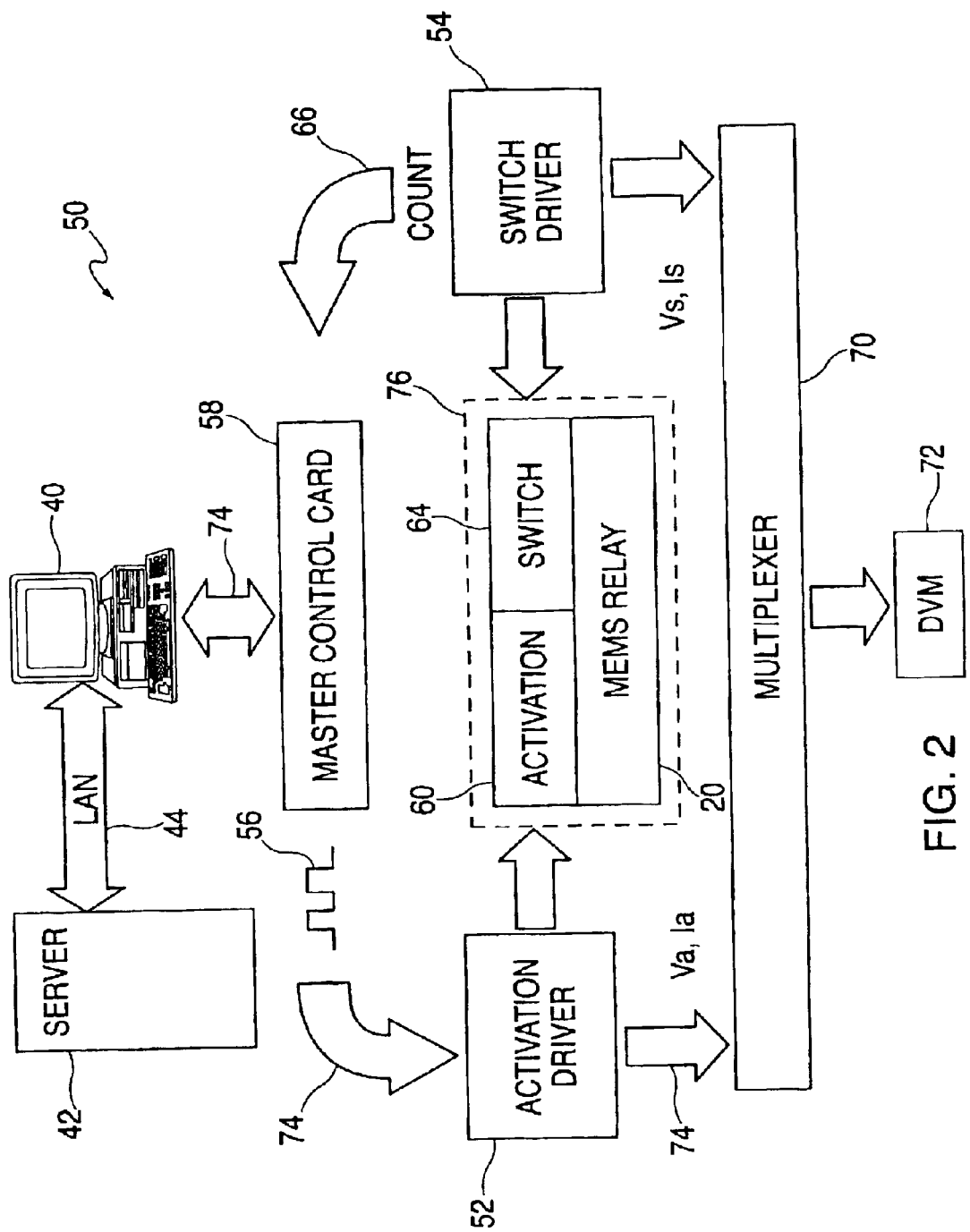
FIG. 2 is a block diagram outlining an exemplary embodiment of a stress testing apparatus having a MEMs device operably connected thereto.

Referring now to FIG. 2, one embodiment of a system and method for testing performance characteristics of a MEMs device 20 having movable mechanical members is illustrated. The system 50 of this embodiment includes MEMS device 20 in the center as illustrated in FIG. 2, surrounded by the various components of system 50. The components include a driver channel that is divided into two parts, an activation driver 52 and a switch driver 54. The activation driver 52 receives an activation waveform 56 (or DC voltage) from a master control card 58. Master control card 58 drives waveform 56 to an activation side 60 of relay 20. Sense points in the activation driver 52 provide readout data or readback of the activation voltage (Va) and the current (Ia) drawn by activation of the device 20.

The switch driver 54 provides a load to a switch side 64 of relay 20. The load is defined as a voltage limited constant current. In other words, when the switch of device 20 is closed, it passes a constant current, and when the switch is open, a limited voltage is present across the contacts 28, 30 (FIG. 1). The values of the voltage and current are set on a per channel basis (e.g., each channel can be set to a different load condition). Each channel is individually programmable for load current (contacts closed) and load voltage (contacts open). The values of the contact voltage and current are measured as per the activation driver 52. In this way, contact resistance can be measured, and electromigration studies may be performed. Sense points in the switch driver 54 provide readout data or readback of the load voltage (Vs) and current (Is), and for calculation of the contact resistance. Since the activation waveform 56 is a pulse train of a predetermined length, each switch driver 54 also includes a digital counter indicated generally with arrow 66 used to count the actual number of closures of the switch contacts 28, 30. This allows for verification of the operation of the device for wear-out and lifetime qualifications. This further guarantees that the MEMS device 20 has received the required amount of stress closures at the load provided by the switch driver 54.

The set up and control of drivers 52 and 54 are provided by the master control card 58, which is in communication with the controlling computer 40 via an IEEE bus generally depicted by arrows 74. The computer 40 also controls a solid state analog multiplexer 70 and digital volt meter (DVM) 72 through which all of the analog readback is performed. Computer 40 with custom software is configured to provide all of the system control, data acquisition, data storage, and data analysis. The IEEE bus also provides control of an oven (shown generally in phantom at 76) socketed with 24 sockets, each socket supporting two MEMS devices 20. In this manner, up to 48 devices 20 may be stressed at temperatures preferably exceeding about 150 Â° C. up to 225Â° C. However, it is contemplated that any number of devices may be stressed at temperatures exceeding 300Â° C. and is not limited to any particular temperature range. The computer 40 may be a PC controller that also communicates with the master control card 58 via an RS232 serial bus. The master control card 58 is configured to provide all of the low level control for system 50, including the activation drivers 52, the switch drivers 54, the contact closure counters 66, and the analog readback multiplexers 70.

An activation waveform generator (not shown), located on the master control card 58, is capable of generating wave shapes with two positive voltage levels to the activation driver 52. The activation driver provides the voltage (DC) or the pulse train (AC) required to operate and/or stress the MEMS device 20. Activation driver 52 is configured to drive an accurate 0–30V DC for simple device operation and pull-in/drop-out/time dependent dielectric breakdown (TDDB) tests. Activation driver 52 is further configured to generate a pulse train consisting of a precise number of pulses for lifetime qualifications. These pulses can be simple two level (on-off) pulses, or the on level can be divided into two regions (See FIGS. 3 and 4). The (usually higher) activation voltage is applied for a (usually) short time to activate the MEMS device 20, then the somewhat lower maintaining voltage is applied for the duration of the pulse. Two positive levels may be required because the MEMS relay 20 may have a higher pull-in voltage and a lower maintaining voltage. It should be noted that excessive stress may occur if the waveform 56 is simply set to the pull-in voltage for the duration of the positive level.

All aspects of the activation pulse train are programmable from the PC controller or computer 40 (e.g., activation voltage magnitude, activation voltage duration, maintaining voltage magnitude, maintaining voltage duration, and off duration). The values of the applied maintaining voltage, as well as the current drawn by the activation structure, are able to be read back via the analog readback multiplexer 70 and the DVM 72.

The voltages and timings, as well as the pulse train length, are all programmable through software control from the controlling computer 40. In an exemplary embodiment, the voltages can range from about 0 to about 30 volts while the timings range from about 10 microseconds to about 10 milliseconds. Filtering is present to slow down the rise and fall times. The pulse train lengths are programmable from about 1 to about 10,000. It will be noted that the 10,000 limit is set in the software and may optionally be increased.

Figure 3:
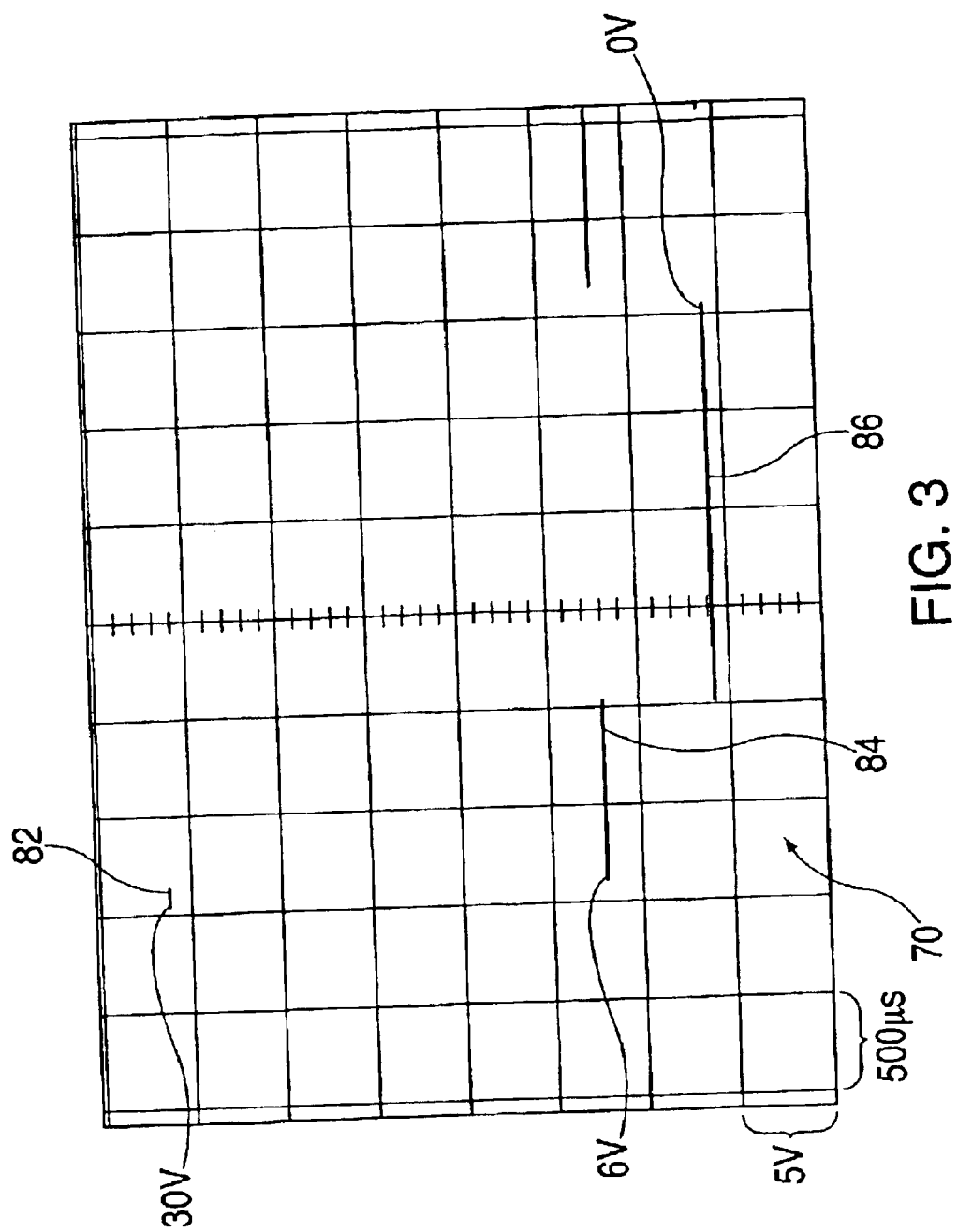
FIG. 3 illustrates an enlarged view of a sample waveform illustrating an activating voltage, maintaining voltage and off duration voltage with respect to time.

Referring to FIG. 3, a sample waveform 80 having three voltage levels between 0 and 30V DC is illustrated. First, a 30V DC pull-in voltage is depicted ay 82 for a duration of 0.1 ms to activate device 20, while a 6V DC maintaining voltage at 84 follows for a duration of 0.9 ms. Then 0V is depicted at 86 for a duration of 2 ms representative of switch contacts 28 and 30 in an open position.

Figure 4:
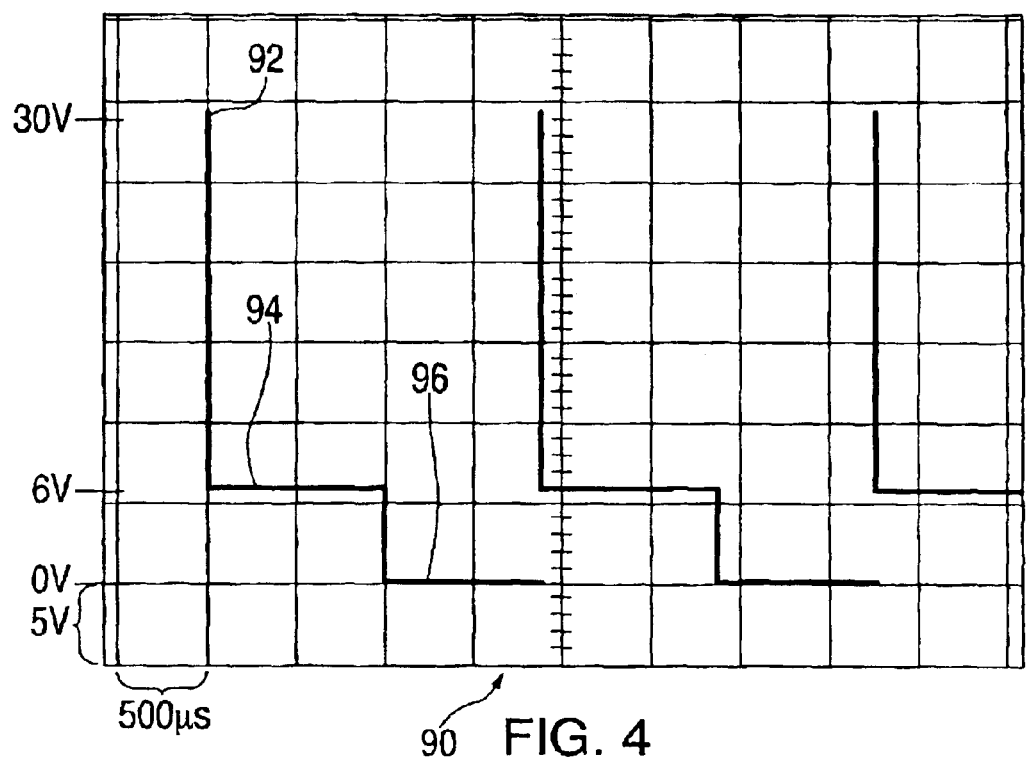
FIG. 4 depicts another sample waveform illustrating two activating voltages, two maintaining voltages and an off duration voltage therebetween with respect to time.
Figure 5:
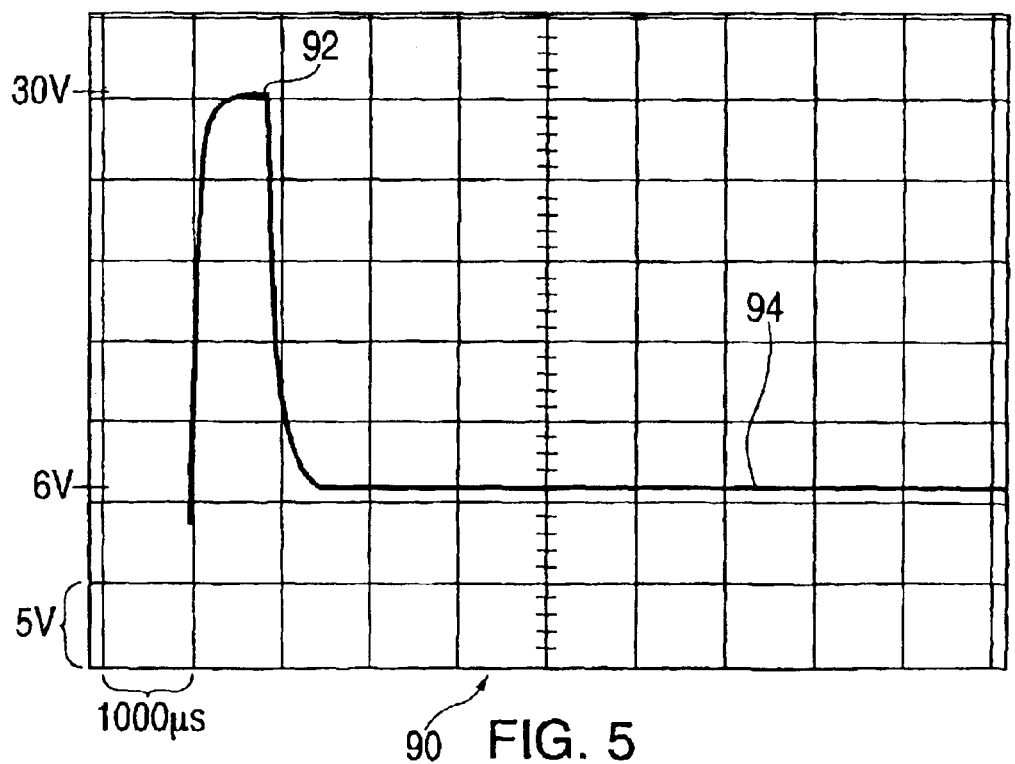
FIG. 5 depicts an the sample waveform illustrated in FIG. 4 with respect to a higher resolution of time to illustrate an increase in voltage to a pull-in voltage or activation voltage.

Referring now to FIGS. 4 and 5, another sample waveform 90 having three voltage levels between 0 and 30V DC is illustrated. First, a 30V DC pull-in voltage is depicted at 92 for a duration of 10 us or 0.01 ms to activate device 20, while a 6V DC maintaining voltage at 94 follows for a duration of 990 us or 0.99 ms. Then 0V is depicted at 96 in FIG. 5 for a duration of 1 ms representative of switch contacts 28 and 30 in an open position.

Figure 6:
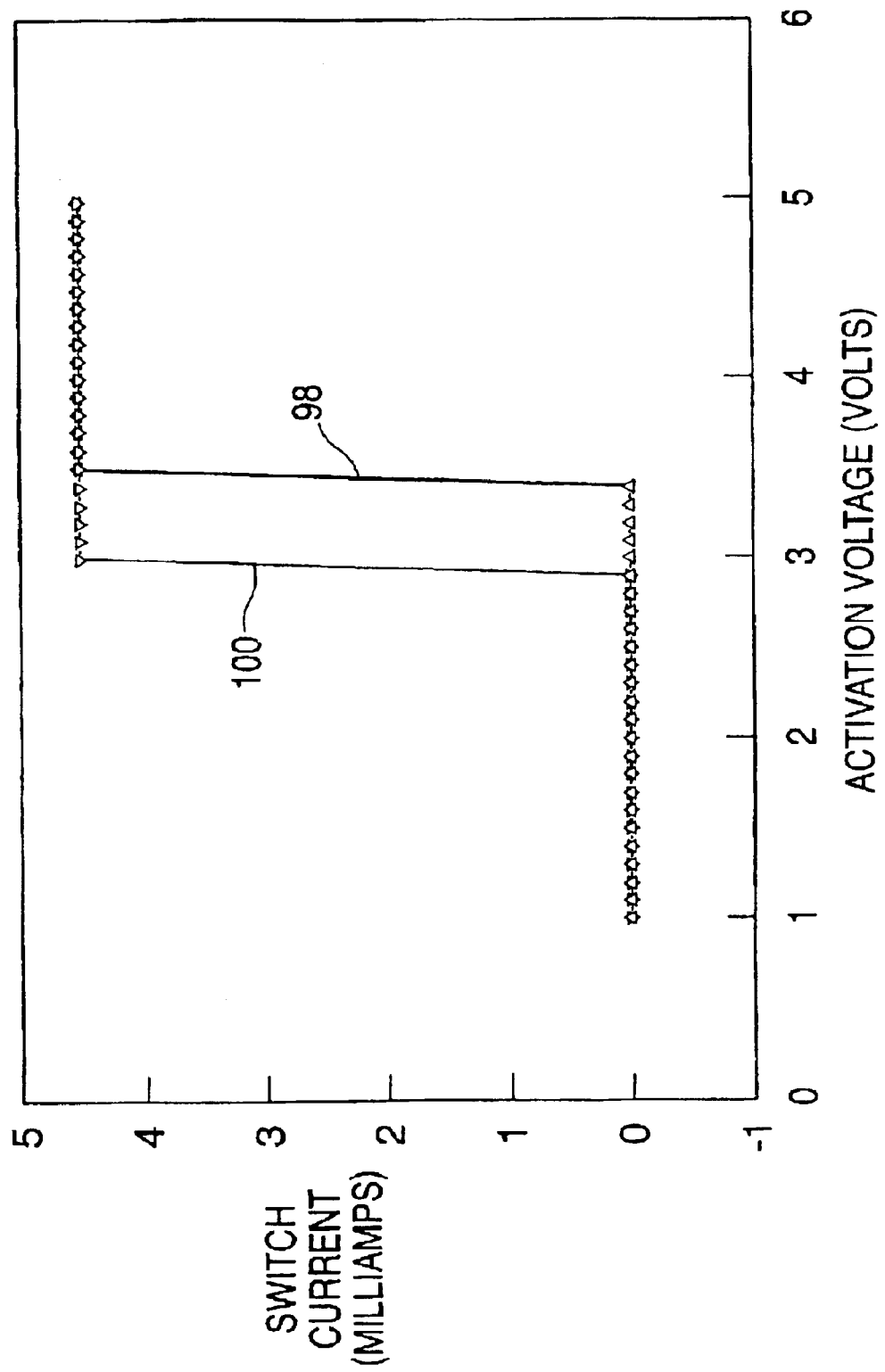
FIG. 6 illustrates readout data of pull-in and drop-out voltage measurements in a graph of switch current vs. activation voltage.

In addition to pulse trains, the activation waveform generator in master control card 58 is configured to provide accurate DC levels, within about 5 millivolts for example, for pull-in and drop-out voltage characterizations. A graphical representation shows the action of the switch in FIG. 6. FIG. 6 illustrates a graph of switch current versus activation voltage where in one example, a pull-in voltage characterization is depicted at 98 and a corresponding drop-out voltage characterization is depicted at 100.

In-situ data is accumulated during stress, and will consist of the pulse counts from the switch driver to ensure that stress has actually occurred. Readout data is accumulated by periodically interrupting stress and measuring device performance. This will consist of pull-in and drop-out voltage measurements.

The pull-in and drop-out voltages can be determined at each readout time by processing the data using a contact resistance criterion. This will create a table of pull-in voltage as a function of the number of switch actions. When the pull-in voltage exceeds predetermined limits, the end of life of the device has been reached. This process can be repeated for various relay designs, switch metallurgies, and loads to fully understand, improve and qualify the MEMS technology.

The above described embodiments provide for a series of stresses and measurements on samples of proposed devices. The operations are performed on an actuation side and a contact or switch side, as well as on the functional interaction between the two on a plurality of devices for determining electrical parametrics and functional lifetime studies of the proposed devices. Thus, providing a system and method for performing a quality and reliability study of the same.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for testing performance characteristics of a micro electromechanical device, the micro electromechanical device having movable mechanical members, wherein the system comprises:
   an activation driver configured to receive and drive a waveform to an activation side of the micro electromechanical device, said activation driver configured to provide readback of an activation voltage and activation current drawn by activation of the micro electromechanical device;
   a switch driver configured to provide a load to a switch side of the micro electromechanical device, said switch driver configured to provide readback of a load voltage and a load current drawn by the micro electromechanical device;
   a master control card (MCC) configured to control said activation and switch drivers;
   a digital volt meter (DVM) in operable communication with the micro electromechanical device, said DVM configured to read back analog readback;
   an analog multiplexer configured to provide said analog readback to a corresponding activation driver or switch driver; and
   a computer in operable communication with said multiplexer, DVM and MCC, said computer having software configured to provide system control, data acquisition, data storage, and data analysis, said operable communication between said computer and said multiplexer, DVM and MCC including an IEEE bus;
   wherein said IEEE bus provides control of an oven configured to stress the micro electromechanical device at a predetermined temperature.

2. The system of claim 1 wherein said waveform is a pulse train having a predetermined length.

3. The system of claim 2 wherein said switch driver includes a digital counter configured to count an actual number of switch closures corresponding to said predetermined length of said pulse train allowing verification of the device for one of wear out and lifetime qualification of the device.

4. The system of claim 1 wherein said oven is socketed with 24 sockets, each socket supporting two micro electromechanical devices, said oven configured to stress 48 micro electromechanical devices at temperatures exceeding 150° C.

5. The system of claim 1 wherein said activation driver is configured to generate a pulse train being at least one of a two level and a three level pulse train.

6. The system of claim 5 wherein all aspects of said pulse train are programmable by said computer.

7. The system of claim 6 wherein said aspects include at least one of an activation voltage magnitude, activation voltage duration, maintaining voltage magnitude, maintaining voltage duration, and off duration.

8. The system of claim 1 wherein said switch driver includes a plurality of channels, each channel individually programmable for said load current and said load voltage.

9. The system of claim 8 wherein said each channel being set to a different load condition.

10. A method for testing performance characteristics of a micro electromechanical device, the micro electromechanical device having movable mechanical members, wherein the method comprises:
   configuring an activation driver to receive and drive a waveform to an activation side of the micro electromechanical device;
   configuring said activation driver to provide readback of an activation voltage and activation current drawn by activation of the micro electromechanical device;
   configuring a switch driver to provide a load to a switch side of the micro electromechanical device, said switch driver configured to provide readback of a load voltage and a load current drawn by the micro electromechanical device;

configuring a master control card (MCC) to control said activation and switch drivers;

configuring a digital volt meter (DVM) to read back analog readback;

operably communicating said DVM with the micro electromechanical device;

configuring an analog multiplexer to provide said analog readback to a corresponding activation driver or switch driver; and operably communicating a computer with said multiplexer, DVM and MCC, said computer having software configured to provide system control, data acquisition, data storage, and data analysis said operable communication between said computer and said multiplexer, DVM and MCC including an IEEE bus;

wherein said IEEE bus provides control of an oven configured to stress the micro electromechanical device at a predetermined temperature.

11. The method of claim 10 wherein said waveform is a pulse train having a predetermined length.

12. The method of claim 11 wherein configuring said switch driver includes a digital counter configured to count an actual number of switch closures corresponding to said predetermined length of said pulse train allowing verification of the device for one of wear out and lifetime qualification of the device.

13. The method of claim 10 wherein said activation driver is configured to generate a pulse train being at least one of a two level and a three level pulse train.

14. The method of claim 13 wherein all aspects of said pulse train are programmable by said computer, said aspects include at least one of an activation voltage magnitude, activation voltage duration, maintaining voltage magnitude, maintaining voltage duration, and off duration.

15. The method of claim 10 wherein said switch driver includes a plurality of channels, each channel individually programmable for said load current and said load voltage.

16. The system of claim 15 wherein said each channel being set to a different load condition.

* * * * *